(12) United States Patent
Lee et al.

(10) Patent No.: US 11,791,783 B2
(45) Date of Patent: Oct. 17, 2023

(54) POWER AMPLIFIER SYSTEM

(71) Applicant: Samsung Electro-Mechanics Co., Ltd., Suwon-si (KR)

(72) Inventors: Geunyong Lee, Suwon-si (KR); Suyeon Han, Suwon-si (KR); Seungchul Pyo, Suwon-si (KR); Youngsik Hur, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 172 days.

(21) Appl. No.: 17/102,663

(22) Filed: Nov. 24, 2020

(65) Prior Publication Data

US 2022/0085774 A1 Mar. 17, 2022

(30) Foreign Application Priority Data

Sep. 14, 2020 (KR) .......................... 10-2020-0117727

(51) Int. Cl.
| | | |
|---|---|---|
| H03F 1/07 | (2006.01) | |
| H03F 3/24 | (2006.01) | |
| H03F 3/195 | (2006.01) | |
| H03F 1/56 | (2006.01) | |

(52) U.S. Cl.
CPC ............. *H03F 3/245* (2013.01); *H03F 1/565* (2013.01); *H03F 3/195* (2013.01); *H03F 2200/318* (2013.01); *H03F 2200/451* (2013.01)

(58) Field of Classification Search
CPC ........... H03F 1/07; H03F 1/0288; H03F 3/191

USPC ..................................... 330/124 R, 295, 302
See application file for complete search history.

(56) References Cited

U.S. PATENT DOCUMENTS

| | | | |
|---|---|---|---|
| 8,847,680 B2 | 9/2014 | Bowles et al. | |
| 8,872,583 B2* | 10/2014 | Lee ......................... | H03F 3/602 |
| | | | 330/149 |
| 9,685,918 B2* | 6/2017 | Li ........................... | H03F 3/211 |
| 10,263,649 B2* | 4/2019 | Wang ..................... | H03F 1/565 |
| 10,491,176 B1* | 11/2019 | Hur ........................ | H03F 3/191 |
| 11,152,895 B2* | 10/2021 | Scott ..................... | H03F 1/0288 |
| 2012/0231753 A1* | 9/2012 | Maslennikov ........ | H03F 1/0288 |
| | | | 455/249.1 |
| 2015/0188501 A1 | 7/2015 | Choi et al. | |

FOREIGN PATENT DOCUMENTS

KR 10-2015-0078386 A 7/2015

\* cited by examiner

*Primary Examiner* — Henry Choe
(74) *Attorney, Agent, or Firm* — NSIP Law

(57) ABSTRACT

A power amplifier system includes: a drive stage configured to amplify an RF input signal and implemented in a substrate containing silicon; a power stage including a carrier amplifier configured to amplify a base signal from the RF input signal as amplified by the drive stage, and a peaking amplifier configured to amplify a peak signal from the RF input signal as amplified by the drive stage, the power stage being implemented in a substrate containing gallium arsenide; and a phase compensation circuit configured to change a phase of the RF input signal, wherein either the carrier amplifier or the peaking amplifier is connected to the phase compensation circuit.

20 Claims, 7 Drawing Sheets

1001

1002

1003

1004

POWER AMPLIFIER SYSTEM

CROSS-REFERENCE TO RELATED APPLICATIONS

This application claims the benefit under 35 U.S.C. § 119(a) of Korean Patent Application No. 10-2020-0117727 filed on Sep. 14, 2020 in the Korean Intellectual Property Office, the entire disclosure of which is incorporated herein by reference for all purposes.

BACKGROUND

1. Field

The following description relates to a power amplifier system.

2. Description of Related Art

A wireless communication system adopts various digital modulation and demodulation methods depending on evolution of communication standards. An existing code division multiple access (CDMA) communication system employs a quadrature phase shift keying (QPSK) method, and a wireless LAN depending on an IEEE communication standard employs an orthogonal frequency division multiplexing (OFDM) method. In addition, recent 3GPP standard standards such as long term evolution (LTE), LTE-advanced, and 5G employ the QPSK method, a quadrature amplitude modulation (QAM) method, and the OFDM method. These wireless communication standards employ a linear modulation method requiring that a size or phase of a transmission signal be maintained during transmission.

Meanwhile, a transmission device used in a wireless communication system includes a power amplifier that amplifies a radio frequency (RF) signal in order to increase a transmission distance. This power amplifier, which is a circuit disposed at an end portion of a transmitting device, is an important circuit element that affects output power, linearity, and power efficiency of a wireless communication system.

3GPP newly defined the 5G NR (New Radio) standard developed from the existing LTE standard. It is required that the power amplifier have high linear power and high efficiency in order to meet the 5G NR specification, and it is also required that the power amplifier have high reliability. In addition, since an area and cost occupied by the power amplifier in the wireless communication system is large, it is desirable to reduce the area and cost of the power amplifier as the wireless communication system is miniaturized.

The above information disclosed in this Background section is only for enhancement of understanding of the background of the disclosure, and therefore it may contain information that does not form the prior art that is already known.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power amplifier system includes: a drive stage configured to amplify an RF input signal and implemented in a substrate containing silicon; a power stage including a carrier amplifier configured to amplify a base signal from the RF input signal as amplified by the drive stage, and a peaking amplifier configured to amplify a peak signal from the RF input signal as amplified by the drive stage, the power stage being implemented in a substrate containing gallium arsenide; and a phase compensation circuit configured to change a phase of the RF input signal, wherein either the carrier amplifier or the peaking amplifier is connected to the phase compensation circuit.

The power amplifier system may further include: a first integrated circuit (IC) in which the drive stage is implemented; and a second IC in which the power stage is implemented independently of the first IC.

The power amplifier system may further include: a quarter wave circuit connected to an output stage of the carrier amplifier to change a phase of the amplified base signal.

The power amplifier system may further include: an inter-stage matcher including the phase compensation circuit, and configured to match impedance of a signal transfer path between the drive stage and the power stage.

The power amplifier system may further include: an input matcher including the phase compensation circuit, and configured to match impedance of a signal transfer path between a terminal for receiving the RF input signal and the power stage.

The drive stage may include: another carrier amplifier configured to amplify a base signal from the RF input signal; and another peaking amplifier configured to amplify a peak signal from the RF input signal.

The RF input signal may include an inverted RF input signal and a non-inverted RF input signal, and the drive stage may be further configured to amplify a difference between the inverted RF input signal and the non-inverted RF input signal.

The drive stage may include: a first drive amplifier configured to receive and amplify a non-inverted RF input signal of the RF input signal; and a second drive amplifier configured to receive and amplify an inverted RF input signal of the RF input signal.

The carrier amplifier may include: a first carrier amplifier configured to amplify a base signal from the non-inverted RF input signal as amplified by the first drive amplifier; and a second carrier amplifier configured to amplify a base signal from the inverted RF input signal as amplified by the second drive amplifier. The peaking amplifier may include: a first peaking amplifier configured to amplify a peak signal from the non-inverted RF input signal as amplified by the first drive amplifier; and a second peaking amplifier configured to amplify a peak signal from the inverted RF input signal as amplified by the second drive amplifier.

The drive stage may include: a first carrier amplifier configured to amplify a base signal from a non-inverted RF input signal of the RF input signal; a second carrier amplifier configured to amplify a base signal from an inverted RF input signal of the RF input signal; a first peaking amplifier configured to amplify a peak signal from the non-inverted RF input signal of the RF input signal; and a second peaking amplifier configured to amplify a peak signal from the inverted RF input signal of the RF input signal.

The carrier amplifier may further include: a third carrier amplifier configured to further amplify the amplified base signal from the non-inverted RF input signal; and a fourth carrier amplifier configured to further amplify the amplified base signal from the inverted RF input signal. The peaking amplifier may include: a third peaking amplifier configured to further amplify the amplified peak signal from the non-inverted RF input signal; and a fourth peaking amplifier configured to further amplify the amplified peak signal from the inverted RF input signal.

In another general aspect, a power amplifier system includes: a drive stage configured to amplify an RF input signal and implemented in a substrate containing silicon; a power stage including a carrier amplifier configured to amplify a base signal from the RF input signal as amplified by the drive stage, and a peaking amplifier configured to amplify a peak signal from the RF signal as amplified by the drive stage, the power stage being implemented in a substrate containing gallium arsenide; and an output matcher including a quarter wave circuit configured to match impedance of a signal transfer path between the power stage and a terminal for outputting an RF output signal, and change a phase of the amplified base signal.

The power amplifier system may further include: an inter-stage matcher including a phase compensation circuit configured to match impedance of a signal transfer path between the drive stage and the power stage, and change a phase of the RF input signal.

The power amplifier system may further include: an input matcher including a phase compensation circuit configured to match impedance of a signal transfer path between a terminal for receiving the RF input signal and the power stage, and change the phase of the RF signal.

The drive stage may include: another carrier amplifier configured to amplify a base signal from the RF input signal; and another peaking amplifier configured to amplify a peak signal from the RF input signal.

The RF input signal may include an inverted RF input signal and a non-inverted RF input signal, and the drive stage may be further configured to amplify a difference between the inverted RF input signal and the non-inverted RF input signal.

In another general aspect, a power amplifier system includes: a first integrated circuit (IC) formed on a first substrate made of a first material, the first IC including a drive stage configured to amplify an RF input signal; a second IC formed on a second substrate made of a second material different from the first material, the second IC including a power stage configured to amplify a base signal from the RF input signal as amplified by the drive stage, and a peaking amplifier configured to amplify a peak signal from the RF input signal as amplified by the drive stage; and a phase compensation circuit connected to the power stage, and configured to change a phase of the RF input signal.

The phase compensation circuit may be disposed in the first IC or the second IC.

The phase compensation circuit may be disposed in a base substrate on which the first IC and the second IC are mounted.

The phase compensation circuit may be disposed in either one of an inter-stage matcher configured to match impedance of a signal transfer path between the drive stage and the power stage, and an input matcher configured to match impedance of a signal transfer path between an input terminal for the RF input signal and the drive stage.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
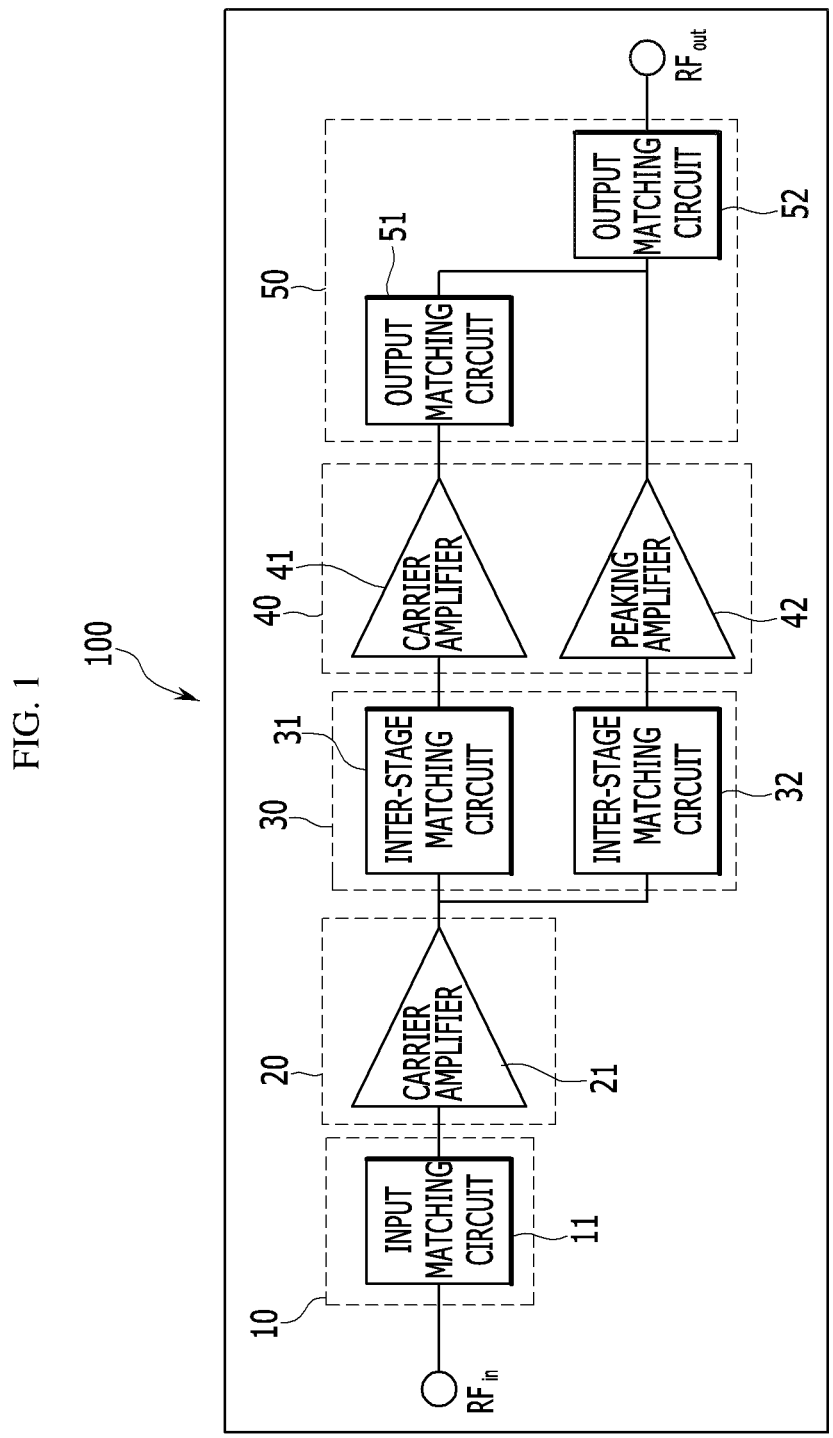
FIG. 1 illustrates a power amplifier system, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

Throughout this disclosure, RF signals may include Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but the disclosure is not limited thereto.

Throughout the specification, a first portion being "mounted" in or on a second portion refers not only to a case in which the first portion is mounted outside of the second portion, but also to a case in which the first portion is mounted inside of or integrated in the second portion.

Figure 2:
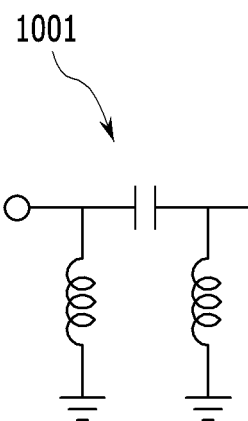
FIG. 2 illustrates circuits for changing a phase of an input signal to +90 degrees or −90 degrees.
Figure 2:
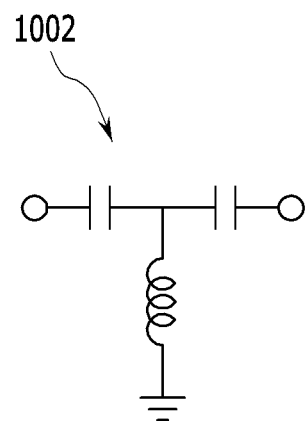
Figure 2:
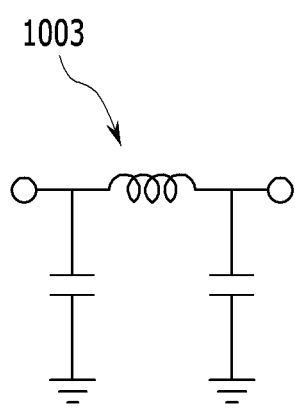
Figure 2:
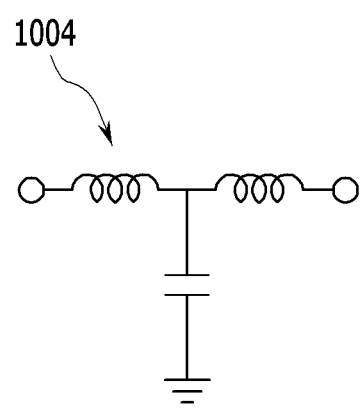

FIG. 1 illustrates a power amplifier system 100, according to an embodiment. FIG. 2 illustrates example circuits for changing a phase of an input signal to +90 degrees or −90 degrees.

Referring to FIG. 1, the power amplifier system 100 receives an RF input signal $RF_{in}$ and amplifies the received RF signal at a predetermined ratio to generate an RF output signal $RF_{out}$. The power amplifier system 100 includes an input matching unit (or input matcher) 10, a drive stage 20, an inter-stage matching unit (or inter-stage matcher) 30, a power stage 40, and an output matching unit (or output matcher) 50.

The input matching unit 10 may match impedance of a signal transfer path between the drive stage 20 and a terminal receiving the RF input signal $RF_{in}$. The input matching unit 10 includes one or more input matching circuits 11. For example, the input matching circuit 11 may be a circuit in which an inductor and a capacitor are connected. However, the input matching unit 10 may be omitted in the power amplifier system 100.

The drive stage 20 receives power and amplifies the RF input signal. The drive stage 20 includes one or more drive amplifiers 21. When the drive amplifier 21 amplifies the RF input signal based on a predetermined gain, a gain of the drive amplifier 21 may be determined based on a breakdown voltage of the drive amplifier 21.

The drive stage 20 may be implemented as an integrated circuit (IC) by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20 is implemented in a silicon substrate, a cost of the power amplifier system 100 may be lowered. Furthermore, since the power amplifier system 100 occupies a largest proportion of a unit cost of a communication module, the unit cost of the communication module may be greatly reduced.

The input matching unit 10 and the drive stage 20 may be manufactured together as one IC by the semiconductor manufacturing process using the substrate containing silicon. In addition, in contrast to the drive stage 20, the input matching unit 10 may not be implemented inside the IC, and may be directly mounted in the communication module independently of the IC. In this case, since the input matching unit 10 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

The inter-stage matching unit 30 may match impedance of a signal transfer path between the drive terminal 20 and the power stage 40. The inter-stage matching unit 30 may include a plurality of inter-stage matching circuits 31 and 32. For example, each of the inter-stage matching circuits 31 and 32 may be a circuit in which an inductor and a capacitor are connected to each other, and may include a transformer. The inter-stage matching circuits 31 and 32 are respectively connected to a carrier amplifier 41 and a peaking amplifier 42, which will be described later. In addition, the inter-stage matching circuits 31 and 32 may be integrated into one inter-stage matching circuit. However, the inter-stage matching unit 30 may be omitted in the power amplifier system 100.

At least one of the inter-stage matching circuits 31 and 32 may include a phase compensation circuit for changing a phase of a signal that is input thereto. In addition, the phase compensation circuit may not be included in the inter-stage matching circuits 31 and 32, and may be independently implemented. The phase compensation circuit may be connected to an input terminal of either the carrier amplifier 41 or the peaking amplifier 42, and, accordingly, the phase of a signal that is input into either the carrier amplifier 41 or the peaking amplifier 42 may be changed. Such a phase compensation circuit, which is a circuit in which an inductor and a capacitor are connected, is included within the inter-stage matching unit 30, and thus an area occupied by the phase compensation circuit in the power amplifier system is smaller than a case of using a quarter wave transmission line. Herein, the quarter wave transmission line is a circuit element that is independent of the inter-stage matching circuit 31/32 and has a large size. For example, the phase compensation circuit may be any one of the circuits illustrated in FIG. 2. In FIG. 2, circuits 1001 and 1002 may perform a phase change of +90 degrees, and circuits 1003 and 1004 may perform a phase change of −90 degrees.

The power stage 40 amplifies an RF signal from the drive stage 20 by receiving power. The power stage 40 includes one or more carrier amplifiers 41 and one or more peaking amplifiers 42. When the carrier amplifier 41 and the peaking amplifier 42 are used, load impedance of each of the carrier amplifier 41 and the peaking amplifier 42 varies depending on an input power level. Due to such a change in the load impedance, amplification efficiency of the power stage 40 may be increased at both low input power and high input power. The carrier amplifier 41 is connected to a terminal of the RF output signal $RF_{out}$ through an impedance inverter to amplify a base signal among RF signals amplified from the drive amplifier 21. The peaking amplifier 42 is connected to the terminal of the RF output signal $RF_{out}$ without using the impedance inverter to amplify a peak signal among the RF signals amplified from the drive amplifier 21. Accordingly, the signals amplified by the carrier amplifier 41 and the peaking amplifier 42 are synthesized by the output matching unit 50 (to be described in more detail later) to output an RF signal, thereby generally increasing amplification efficiency of the power stage 40. For example, when the carrier amplifier 41 has an operating point in a class B and the peaking amplifier 42 has an operating point in a class C, the peaking amplifier 42 starts an operation thereof when the carrier amplifier 41 is saturated.

The power stage 40 may be implemented as a single IC by a semiconductor manufacturing process using a substrate containing gallium arsenic. An IC formed on a substrate containing gallium arsenide can achieve higher power and higher linearity than an IC formed on the substrate containing silicon, and thus the RF signal amplified through the carrier amplifier 41 and the peaking amplifier 42 of the power stage 40 may have high power and linearity, and may have high reliability.

The output matching unit 50 may match impedance of a signal transfer path between the power stage 40 and a terminal through which the amplified RF output signal $RF_{out}$ is outputted, and may change a phase of the signal output from the carrier amplifier 41 and synthesize the phase-changed signal output from the carrier amplifier 41 with the signal outputted from the peaking amplifier 42 to form a synthesized RF signal, and then output the synthesized RF signal to the terminal of the RF output signal $RF_{out}$. The output matching unit 50 may include a plurality of output matching circuits 51 and 52. For example, each of the output matching circuits 51 and 52 may be a circuit in which an inductor and a capacitor are connected to each other, and may include a transformer. However, the output matching unit 50 may be omitted in the power amplifier system 100.

One of the output matching circuits 51 and 52 may include a quarter wave circuit for changing a phase of a signal that is input thereto. In addition, the quarter wave circuit may not be included in the output matching circuits 51 and 52, and may be independently implemented. The quarter wave circuit may be one of the impedance inverters, and may be connected to an output terminal of the carrier amplifier 41. Such a quarter wave circuit, which is a circuit in which an inductor and a capacitor are connected, is included within the output matching unit 50, and thus an area occupied by the quarter wave circuit in the power amplifier system is smaller than a case in which a quarter wave transmission line is used. Herein, the quarter wave transmission line is a circuit element that is independent of the inter-stage matching circuit 31/32 and has a large size. For example, the quarter wave circuit may be any one of the circuits illustrated in FIG. 2. In FIG. 2, the circuits 1001 and 1002 may perform a phase change of +90 degrees, and the circuits 1003 and 1004 may perform a phase change of −90 degrees.

The output matching unit 50 and the power stage 40 may be manufactured together as one IC by the semiconductor manufacturing process using the substrate containing gallium arsenide. In addition, in contrast to the power stage 40, the output matching unit 50 may not be implemented inside the IC, and may be directly mounted in the communication module independently of the IC. In this case, since the output matching unit 50 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

The inter-stage matching unit 30 may be manufactured as a single IC by a semiconductor manufacturing process using a substrate containing gallium arsenide together with the power stage 40. In addition, the inter-stage matching unit 30 may be manufactured as a single IC by a semiconductor manufacturing process using a substrate containing silicon together with the drive stage 20, and, in this case, the manufacturing cost may be lower than a case in which the substrate containing gallium arsenic is used.

The inter-stage matching unit 30 may also not be included anywhere inside the IC in which the drive stage 20 is implemented or the IC in which the power stage 40 is implemented, and may be directly mounted in the communication module independently of these ICs. In this case, since the inter-stage matching unit 30 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Further, in the case where the inter-stage matching unit 30 includes a phase compensation circuit, when the inter-stage matching unit 30 is manufactured as a single IC together with the drive stage 20 and/or the power stage 40, an IC manufacturing cost may increase compared with a case where the inter-stage matching unit 30 does not include the phase compensation circuit, due to an area occupied by the phase compensation circuit. Accordingly, in the case in which the inter-stage matching unit 30 includes the phase compensation circuit, when the inter-stage matching unit 30 is directly mounted in the communication module independently of the IC, a total manufacturing cost may be minimized. In addition, when the phase compensation circuit of the inter-stage matching unit 30 is directly mounted in the communication module independently of the IC, changes in load impedance of the carrier amplifier 41 and the peaking amplifier 42 may be optimized by optimizing inductance values or capacitance values of circuit elements constituting the phase compensation circuit.

Figure 3:
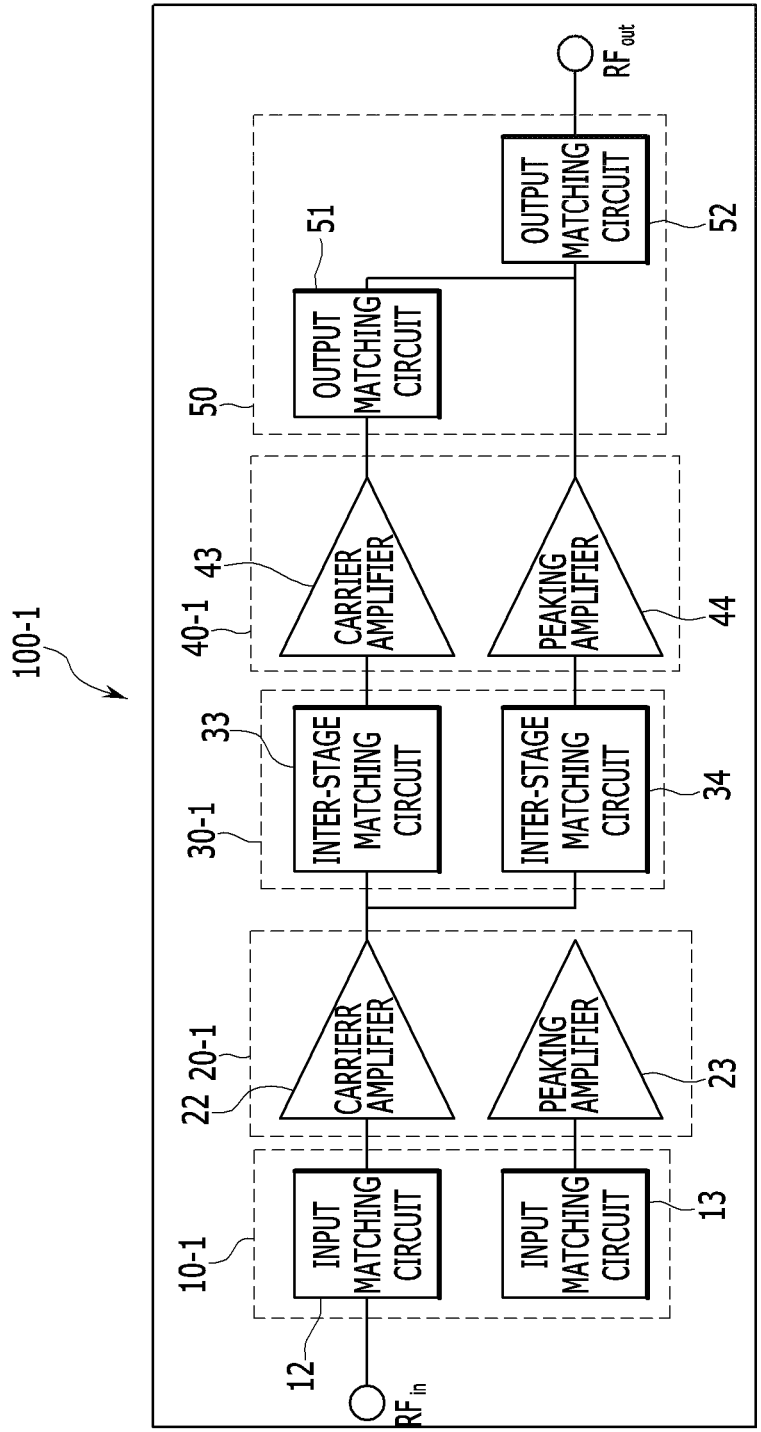
FIG. 3 illustrates a power amplifier system, according to an embodiment.

FIG. 3 illustrates a power amplifier system 100-1, according to an embodiment.

Referring to FIG. 3, in the power amplifier system 100-1, an input matching unit 10-1 includes a phase compensation circuit, but an inter-stage matching unit 30-1 does not include the phase compensation circuit, and a drive stage 20-1 includes a carrier amplifier 22 and a peaking amplifier 23.

The phase compensation circuit may be connected to an input terminal of either the carrier amplifier 22 or the peaking amplifier 23 of the drive stage 20-1, and accordingly, a phase of a signal that is input into either the carrier amplifier 22 and the peaking amplifier 23 may be changed. Such a phase compensation circuit, which is a circuit in which an inductor and a capacitor are connected, is included within the input matching unit 10-1, and thus an area occupied by the phase compensation circuit in the power amplifier system 100-1 is smaller than a case in which a quarter wave transmission line is used. Herein, the quarter wave transmission line is a circuit element that is independent of the inter-stage matching circuit 33/34 and has a large size. For example, the phase compensation circuit may be any one of the circuits illustrated in FIG. 2. In FIG. 2, the circuits 1001 and 1002 may perform a phase change of +90 degrees, and the circuits 1003 and 1004 may perform a phase change of −90 degrees.

The input matching unit 10-1 may match impedance of a signal transfer path between the drive stage 20-1 and a terminal receiving the RF input signal $RF_{in}$. The input matching unit 10 may include a plurality of input matching circuits 12 and 13, and any one of the input matching circuits 12 and 13 may include a phase compensation circuit. In addition, the phase compensation circuit may not be included in the input matching circuits 12 and 13, and may be independently implemented. For example, each of the input matching circuits 12 and 13 may be a circuit in which an inductor and a capacitor are connected to each other, and may include a transformer. The input matching circuits 12 and 13 are respectively connected to a carrier amplifier 22 and a peaking amplifier 23. In addition, the input matching circuits 12 and 13 may be integrated into one inter-stage matching circuit. However, the input matching unit 10 may be omitted in the power amplifier system 100-1.

The drive stage 20-1 receives power and amplifies the RF input signal. The drive stage 20-1 includes one or more carrier amplifiers 22 and one or more peaking amplifiers 23. When the carrier amplifier 22 and the peaking amplifier 23 are used, load impedance of each of the carrier amplifier 22 and the peaking amplifier 23 varies depending on an input power level. Due to such a change in the load impedance, amplification efficiency of the drive stage 20-1 may be increased at both low input power and high input power. The carrier amplifier 22 is connected to a terminal of the RF output signal $RF_{out}$ through an impedance inverter to amplify a base signal among RF input signals $RF_{in}$. The peaking amplifier 23 is connected to a terminal of the RF output signal $RF_{out}$ without using the impedance inverter to amplify a peak signal among RF input signals $RF_{in}$. For example, when the carrier amplifier 22 has an operating point in a class B and the peaking amplifier 23 has an operating point in a class C, the peaking amplifier 23 starts an operation thereof when the carrier amplifier 22 is saturated.

The drive stage 20-1 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20-1 is implemented in a silicon substrate, a cost of the power amplifier system 100-1 may be lowered. Furthermore, since the power amplifier system 100-1 occupies a largest proportion of a unit cost of a communication module, the unit cost of the communication module may be greatly reduced.

The input matching unit 10-1 and the drive stage 20-1 may be manufactured together as one IC by the semiconductor manufacturing process using the substrate containing silicon. In addition, in contrast to the drive stage 20, the input matching unit 10-1 may not be implemented inside the IC, and may be directly mounted in the communication module independently of the IC. In this case, since the input matching unit 10-1 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Further, in the case in which the input matching unit 10-1 includes a phase compensation circuit, when the input matching unit 10-1 is manufactured as a single IC together with the drive stage 20-1, an IC manufacturing cost may increase compared with a case in which the input matching unit 10-1 does not include the phase compensation circuit, due to an area occupied by the phase compensation circuit. Accordingly, in the case in which the input matching unit 10-1 includes the phase compensation circuit, when the input matching unit 10-1 is directly mounted in the communication module independently of the IC, a total manufacturing cost may be minimized. In addition, when the phase compensation circuit of the input matching unit 10-1 is directly mounted in the communication module independently of the IC, changes in load impedance of the carrier amplifier 22 and the peaking amplifier 23 may be optimized by optimizing inductance values or capacitance values of circuit elements constituting the phase compensation circuit.

The inter-stage matching unit 30-1 may match impedance of a signal transfer path between the drive terminal 20-1 and the power stage 40, and does not include a phase compensation circuit. The inter-stage matching unit 30-1 may include a plurality of inter-stage matching circuits 33 and 34. For example, each of the inter-stage matching circuits 33 and 34 may be a circuit in which an inductor and a capacitor are connected to each other, and may include a transformer. The inter-stage matching circuits 33 and 34 are respectively connected to a carrier amplifier 43 and a peaking amplifier 44 of the power stage 40. In addition, the inter-stage matching circuits 33 and 34 may be integrated into one inter-stage matching circuit. However, the inter-stage matching unit 30-1 may be omitted in the power amplifier system 100-1.

The power stage 40 amplifies an RF signal from the drive stage 20-1 by receiving power. The power stage 40 includes one or more carrier amplifiers 43 and one or more peaking amplifiers 44. The carrier amplifier 43 of the power stage 40 is connected to a terminal of the RF output signal $RF_{out}$ through an impedance inverter, and the peaking amplifier 44 of the power stage 40 is connected to the terminal of the RF output signal $RF_{out}$ without using the impedance inverter. The base signal amplified through the carrier amplifier 22 of the drive stage 20-1 may be amplified through the carrier amplifier 43 of the power stage 40, and the peak signal amplified through the peaking amplifier 23 of the drive stage 20-1 may be amplified through the peaking amplifier 44 of the power stage 40. Accordingly, amplification efficiency of the power stage 40 may be increased as well as amplification efficiency of the drive stage 20 at both low input power and high input power, and thus amplification efficiency of the power amplifier system 100-1 may be maximized. For example, when the carrier amplifier 43 of the power stage 40 has an operating point in a class B and the peaking amplifier 44 of the power stage 40 has an operating point in a class C, the peaking amplifier 44 of the power stage 40 starts an operation thereof when the carrier amplifier 43 of the power stage 40 is saturated.

The power stage 40 may be implemented as a single IC by a semiconductor manufacturing process using a substrate containing gallium arsenic. An IC formed on a substrate containing gallium arsenide can achieve higher power and higher linearity than an IC formed on the substrate containing silicon, and, thus, the RF signal amplified through the carrier amplifier 43 and the peaking amplifier 44 of the power stage 40 may have high power and linearity, and may have high reliability.

The output matching unit 50 may match impedance of a signal transfer path between the power stage 40 and a terminal through which the amplified RF output signal $RF_{out}$ is output, and may change a phase of the signal output from the carrier amplifier 43 of the power stage 40 and synthesize the phase-changed signal output from the carrier amplifier 43 with the signal output from the peaking amplifier 44 of the power stage 40 to form a synthesized RF signal, and then output the synthesized RF signal to the terminal of the RF output signal $RF_{out}$. The output matching unit 50 may include a plurality of output matching circuits 51 and 52. For example, each of the output matching circuits 51 and 52 may be a circuit in which an inductor and a capacitor are connected to each other, and may include a transformer. However, the output matching unit 50 may be omitted in the power amplifier system 100.

One of the output matching circuits 51 and 52 may include a quarter wave circuit for changing a phase of a signal that is input thereto. In addition, the quarter wave circuit may not be included in the output matching circuits 51 and 52, and may be independently implemented. The quarter wave circuit may be one of the impedance inverters, and may be connected to an output terminal of and carrier amplifier 43 of the power stage 40. Such a quarter wave circuit, which is a circuit in which an inductor and a capacitor are connected, is included within the output matching unit 50, and thus an area occupied by the quarter wave circuit in the power amplifier system is smaller than a case of using a quarter wave transmission line. Herein, the quarter wave transmission line is a circuit element that is independent of the inter-stage matching circuit 33/34 and has a large size. For example, the quarter wave circuit may be any one of the circuits illustrated in FIG. 2. In FIG. 2, the circuits 1001 and 1002 may perform a phase change of +90 degrees, and the circuits 1003 and 1004 may perform a phase change of −90 degrees.

The output matching unit 50 and the power stage 40 may be manufactured together as one IC by the semiconductor manufacturing process using the substrate containing gallium arsenide. In addition, in contrast to the power stage 40, the output matching unit 50 is not implemented inside the IC, and may be directly mounted in the communication module independently of the IC. In this case, since the output matching unit 50 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

The inter-stage matching unit 30-1 may be manufactured as a single IC by a semiconductor manufacturing process using a substrate containing gallium arsenide together with the power stage 40. In addition, the inter-stage matching unit 30-1 may be manufactured as a single IC by a semiconductor manufacturing process using a substrate containing silicon together with the drive stage 20-1, and, in this case, the manufacturing cost may be lower than a case in which the substrate containing gallium arsenic is used.

The inter-stage matching unit 30-1 may also not be included anywhere inside the IC in which the drive stage 20-1 is implemented or the IC in which the power stage 40 is implemented, and may be directly mounted in the communication module independently of these ICs. In this case, since the inter-stage matching unit 30-1 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Figure 4:
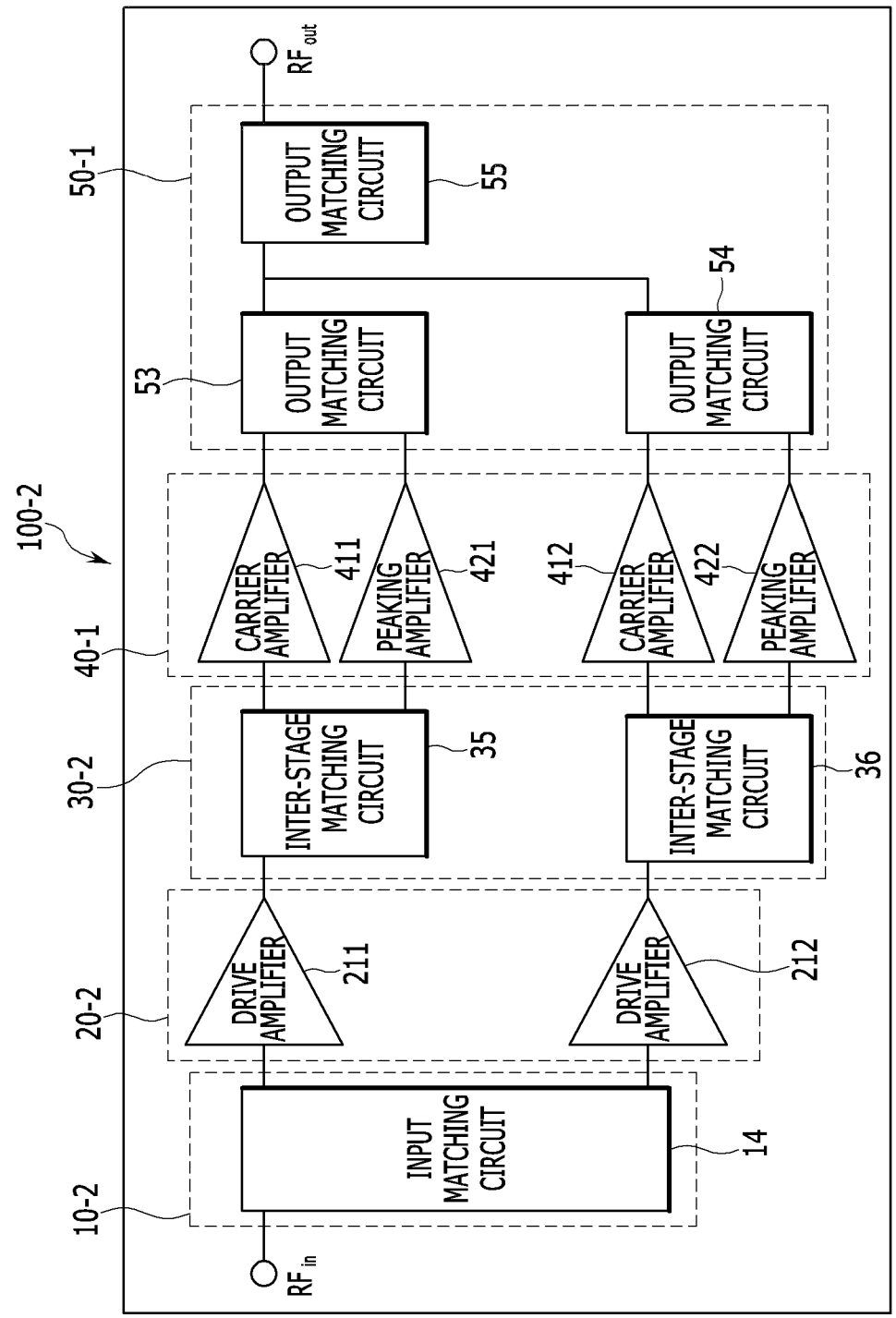
FIG. 4 illustrates a power amplifier system, according to an embodiment.

FIG. 4 illustrates a power amplifier system 100-2, according to an embodiment.

Referring to FIG. 4, in the power amplifier system 100-2, a drive stage 20-2 includes a pair of drive amplifiers 211 and 212 for performing differential amplification, and the drive amplifiers 211 and 212 receive power to amplify a difference between signals input thereto. The drive amplifiers 211 and 212 have a differential mode that greatly amplifies and outputs signals of opposite phases, and a common mode that cancels and outputs signals of a same phase. For example, the drive amplifiers 211 and 212 for performing differential amplification receive an inverted RF input signal $RF_{in}$ and a non-inverted RF input signal $RF_{in}$, respectively, and thus a signal having an amplitude of approximately twice a sum of amplitudes of the inverted RF input signal $RF_{in}$ and the non-inverted RF input signal $RF_{in}$ may be outputted in a differential mode. However, since voltages applied to the drive amplifiers 211 and 212 or currents flowing therein have a same phase, noise included in the voltages or currents may be canceled out of the output of the drive amplifiers 211 and 212. Accordingly, the power amplifier system 100-2 for performing differential amplification may have high linear power and high efficiency.

The drive stage 20-2 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20-2 is implemented in a silicon substrate, a cost of the power amplifier system 100 may be lowered. Furthermore, since the power amplifier system 100-2 occupies a largest proportion of a unit cost of a communication module, the unit cost of the communication module may be greatly reduced.

The input matching unit 10-2 may match impedance of a signal transfer path between the drive stage 20-2 and a terminal receiving the RF input signal $RF_{in}$. The input matching unit 10-2 includes one or more input matching circuits 14. For example, the input matching circuit 14 may be a circuit in which an inductor and a capacitor are connected to each other, and may include a transformer. The input matching circuit 14 receives the RF input signal $RF_{in}$ and then outputs the inverted RF input signal $RF_{in}$ and the non-inverted RF input signal $RF_{in}$, and is connected to the drive amplifiers 211 and 212. However, the input matching unit 10-2 may be omitted in the power amplifier system 100.

The input matching unit 10-2 and the drive stage 20-2 may be manufactured together as one IC by the semiconductor manufacturing process using the substrate containing silicon. In addition, in contrast to the drive stage 20, the input matching unit 10-2 may not be implemented inside the IC, and may be directly mounted in the communication module independently of the IC. In this case, since the input matching unit 10-2 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

An inter-stage matching unit 30-2 may match impedance of a signal transfer path between the drive terminal 20-2 and a power stage 40-1. The inter-stage matching unit 30-2 may include a plurality of inter-stage matching circuits 35 and 36. For example, each of the inter-stage matching circuits 35 and 36 may be a circuit in which an inductor and a capacitor are connected to each other, and may include a transformer. The inter-stage matching circuits 35 and 36 are respectively connected to a pair of a carrier amplifier 411 and a peaking amplifier 421, and another pair of a carrier amplifier 412 and a peaking amplifier 422. In addition, each of the inter-stage matching circuits 35 and 36 may be divided into two parts, which are respectively connected to the carrier amplifiers 411 and 412 and the peaking amplifiers 421 and 422 one-by-one. However, the inter-stage matching unit 30-2 may be omitted in the power amplifier system 100.

Each of the inter-stage matching circuits 35 and 36 may include a phase compensation circuit for changing a phase of a signal that is input thereto. In addition, the phase compensation circuit may not be included in the inter-stage matching circuits 35 and 36, and may be independently implemented. The phase compensation circuit may be connected to an input terminal of either the carrier amplifier 411 or the peaking amplifier 421, and accordingly, the phase of a signal that is input into either the carrier amplifier 411 or the peaking amplifier 421 may be changed. In addition, the phase compensation circuit may be connected to an input terminal of either the carrier amplifier 412 or the peaking amplifier 422, and, accordingly, the phase of a signal that is input into either the carrier amplifier 412 or the peaking amplifier 422 may be changed. Such a phase compensation circuit, which is a circuit in which an inductor and a capacitor are connected, is included within the inter-stage matching unit 30-2, and thus an area occupied by the phase compensation circuit in the power amplifier system is smaller than a case in which a quarter wave transmission line is used. Herein, the quarter wave transmission line is a circuit element that is independent of the inter-stage matching circuit 30-2 and has a large size. For example, the phase compensation circuit may be any one of the circuits illustrated in FIG. 2. In FIG. 2, the circuits 1001 and 1002 may perform a phase change of +90 degrees, and the circuits 1003 and 1004 may perform a phase change of −90 degrees.

The power stage 40-1 amplifies an RF signal from the drive stage 20-2 by receiving power. The power stage 40-1 includes the pair of the carrier amplifier 411 and a peaking amplifier 421, and the other pair of the carrier amplifier 412 and the peaking amplifier 422. When the carrier amplifiers 411 and 412 and the peaking amplifiers 421 and 422 are used, load impedance of each of the carrier amplifiers 411 and 412 and the peaking amplifiers 421 and 422 changes depending on an input power level. Due to such a change in the load impedance, amplification efficiency of the power stage 40-1 may be increased at both low input power and high input power. Each of the carrier amplifiers 411 and 412 is connected to a terminal of the RF output signal $RF_{out}$ through an impedance inverter to amplify each base signal among RF signals amplified from the drive amplifiers 211 and 212, respectively. Each of the peaking amplifiers 421 and 422 is connected to a terminal of the RF output signal $RF_{out}$ without using the impedance inverter to amplify each peak signal among RF signals amplified from the drive amplifiers 211 and 212, respectively. Accordingly, the signals amplified by the carrier amplifiers 411 and 412 and the peaking amplifiers 421 and 422 are synthesized by an output matching unit 50-1 to output an RF signal, thereby generally increasing amplification efficiency of the power stage 40-1. For example, when each of the carrier amplifiers 411 and 412 has an operating point in a class B and each of the peaking amplifiers 421 and 422 has an operating point in a class C, the peaking amplifiers 421 and 422 start operations thereof when the carrier amplifiers 421 and 422 are saturated.

The power stage 40-1 may be implemented as a single IC by a semiconductor manufacturing process using a substrate containing gallium arsenic. An IC formed on a substrate containing gallium arsenide can achieve higher power and higher linearity than an IC formed on the substrate containing silicon, and thus the RF signal amplified through the carrier amplifiers 411 and 412 and the peaking amplifiers 421 and 422 of the power stage 40-1 may have high power and linearity, and may have high reliability.

The output matching unit 50-1 may match impedance of a signal transfer path between the power stage 40-1 and a terminal through which the amplified RF output signal $RF_{out}$ is output, and may change phases of the signals output from the carrier amplifiers 411 and 412 and synthesize the phase-changed signals output from the carrier amplifiers 411 and 412 with the signals output from the peaking amplifiers 421 and 422, respectively, to form respective synthesized RF signals, and then output the respective synthesized RF signals to the terminal of the RF output signal $RF_{out}$. The output matching unit 50-1 may include a plurality of output matching circuits 53, 54, and 55. For example, each of the output matching circuits 53, 54, and 55 may be a circuit in which an inductor and a capacitor are connected to each other, and may include a transformer. However, the output matching unit 50 may be omitted in the power amplifier system 100.

One of the output matching circuits 53, 54, and 55 may include a quarter wave circuit for changing a phase of a signal that is input thereto. In addition, the quarter wave circuit may not be included in the output matching circuits 53, 54, and 55, and may be independently implemented. The quarter wave circuit may be one of the impedance inverters, and may be connected to an output terminal of each of the carrier amplifiers 411 and 412. Such a quarter wave circuit, which is a circuit in which an inductor and a capacitor are connected, is included within the output matching unit 50-1, and thus an area occupied by the quarter wave circuit in the power amplifier system is smaller than a case in which a quarter wave transmission line is used. Herein, the quarter wave transmission line is a circuit element that is independent of the inter-stage matching circuit 35/36 and has a large size. For example, the quarter wave circuit may be any one of the circuits illustrated in FIG. 2. In FIG. 2, the circuits 1001 and 1002 may perform a phase change of +90 degrees, and the circuits 1003 and 1004 may perform a phase change of −90 degrees.

The output matching unit 50-1 together with the power stage 40-2 may be manufactured as one IC by the semiconductor manufacturing process using the substrate containing gallium arsenide. In addition, in contrast to the power stage 40-2, the output matching unit 50-1 may not be implemented inside the IC, and may be directly mounted in the communication module independently of the IC. In this case, since the output matching unit 50-1 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

The inter-stage matching unit 30-2 may be manufactured as a single IC by a semiconductor manufacturing process using a substrate containing gallium arsenide together with the power stage 40-1. In addition, the inter-stage matching unit 30-2 may be manufactured as a single IC by a semiconductor manufacturing process using a substrate containing silicon together with the drive stage 20-2, and, in this case, the manufacturing cost may be lower than a case of using the substrate containing gallium arsenic.

The inter-stage matching unit 30-2 may also not be included anywhere inside the IC in which the drive stage 20-2 is implemented or the IC in which the power stage 40-1 is implemented, and may be directly mounted in the communication module independently of these ICs. In this case, since the inter-stage matching unit 30-2 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Further, in the case in which the inter-stage matching unit 30-2 includes a phase compensation circuit, when the inter-stage matching unit 30-2 is manufactured as a single IC together with the drive stage 20-2 and/or the power stage 40-1, an IC manufacturing cost may increase compared with a case where the inter-stage matching unit 30-2 does not include the phase compensation circuit, due to an area occupied by the phase compensation circuit. Accordingly, in the case in which the inter-stage matching unit 30-2 includes the phase compensation circuit, when the inter-stage matching unit 30-2 is directly mounted in the communication module independently of the IC, a total manufacturing cost may be minimized. In addition, when the phase compensation circuit of the inter-stage matching unit 30-2 is directly mounted in the communication module independently of the IC, changes in load impedance of the carrier amplifiers 411 and 412 and the peaking amplifiers 421 and 422 may be optimized by optimizing inductance values or capacitance values of circuit elements constituting the phase compensation circuit.

Figure 5:
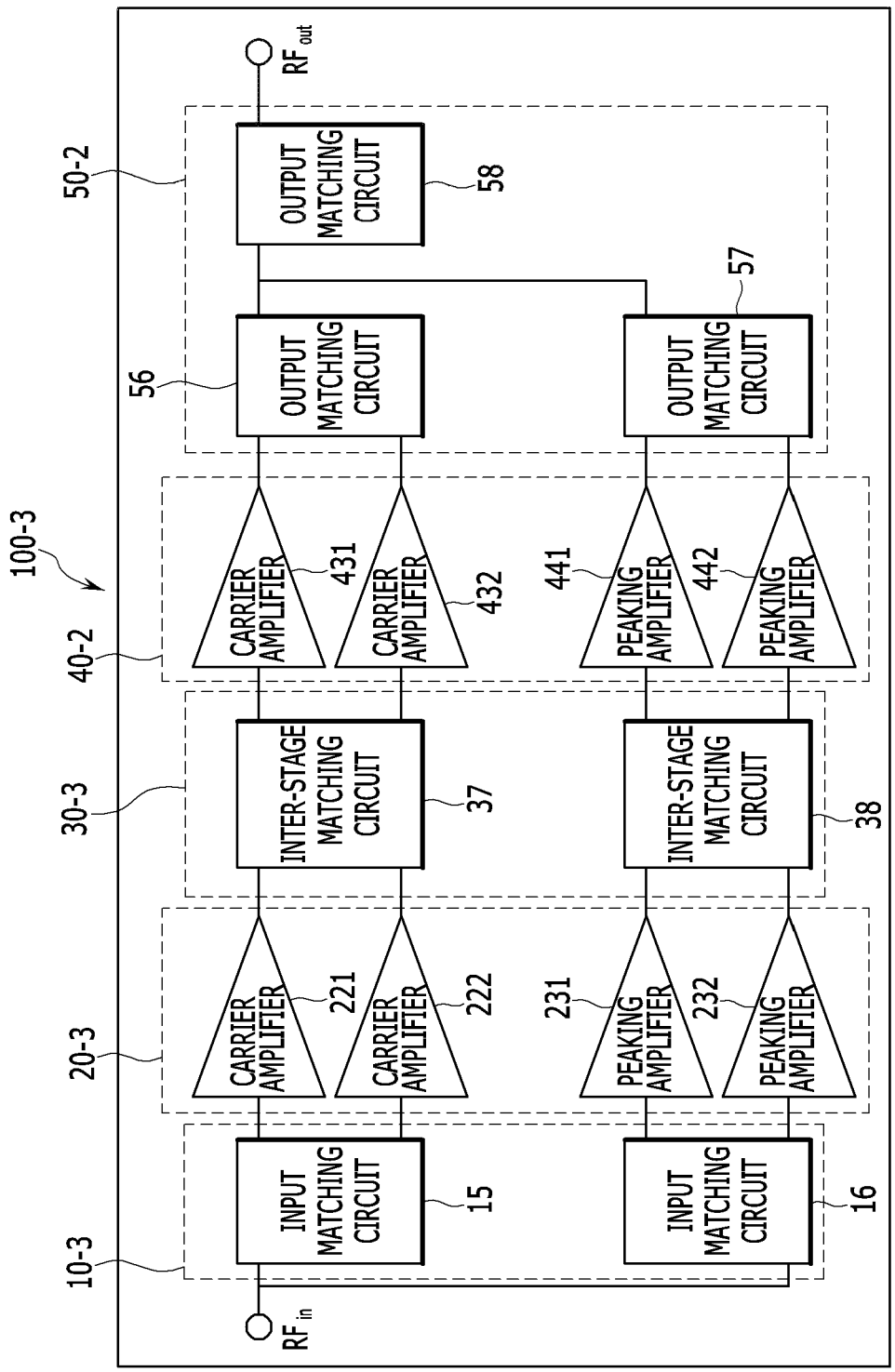
FIG. 5 illustrates a power amplifier system, according to an embodiment.

FIG. 5 illustrates a power amplifier system 100-3, according to an embodiment.

Referring to FIG. 5, in the power amplifier system 100-3, an input matching unit 10-3 includes a phase compensation circuit, but an inter-stage matching unit 30-3 does not include the phase compensation circuit, and a drive stage 20-3 includes a pair of carrier amplifiers 221 and 222 respectively performing differential amplification and a pair of peaking amplifiers 231 and 232.

The phase compensation circuit may be connected to an input terminal of any one of the pair of carrier amplifiers 221 and 222 of the drive stage 20-3 and the pair of peaking amplifiers 231 and 232, and accordingly, a phase of a signal that is input into any one of the pair of carrier amplifiers 221 and 222 and the pair of peaking amplifiers 231 and 232 may be changed. Such a phase compensation circuit, which is a circuit in which an inductor and a capacitor are connected, is included within the input matching unit, and thus an area occupied by the phase compensation circuit in the power amplifier system 100-3 is smaller than a case in which a quarter wave transmission line is used. Herein, the quarter wave transmission line is a circuit element that is independent of the inter-stage matching circuit and has a large size. For example, the phase compensation circuit may be any one of the circuits illustrated in FIG. 2. In FIG. 2, the circuits 1001 and 1002 may perform a phase change of +90 degrees, and the circuits 1003 and 1004 may perform a phase change of −90 degrees.

An input matching unit 10-3 may match impedance of a signal transfer path between the drive stage 20-3 and a terminal receiving the RF input signal $RF_{in}$. The input matching unit 10-3 may include a plurality of input matching circuits 15 and 16, and any one of the input matching circuits 15 and 16 may include a phase compensation circuit. In addition, the phase compensation circuit may not be included in the input matching circuits 15 and 16, and may be independently implemented. For example, each of the input matching circuits 15 and 16 may be a circuit in which an inductor and a capacitor are connected to each other, and may include a transformer. The input matching circuits 15 and 16 may be connected to the pair of carrier amplifiers 221 and 222 and the pair of peaking amplifiers 231 and 232, respectively. In addition, each of the input matching circuits 15 and 16 may be divided into two parts, which are respectively connected to the carrier amplifiers 221 and 222 and the peaking amplifiers 231 and 232 one-by-one. However, the input matching unit 10-3 may be omitted in the power amplifier system 100-3.

In the drive stage 20-3, the carrier amplifiers 221 and 222 amplify a difference between signals input thereto, and the peaking amplifiers 231 and 232 also amplify a difference between signals input thereto. Each of the pair of carrier amplifiers 221 and 222 and the pair of peaking amplifiers 231 and 232 has a differential mode that greatly amplifies and outputs signals of opposite phases, and a common mode that cancels and outputs signals of a same phase. In addition, the carrier amplifiers 221 and 222 are connected to a terminal of the RF output signal $RF_{out}$ through an impedance inverter to amplify a base signal in each of the RF input signals $RF_{in}$ having opposite phases, and a signal having an amplitude of approximately twice a sum of amplitudes of the base signals of the inverted RF input signal $RF_{in}$ and the non-inverted RF input signal $RF_{in}$ may be output in a differential mode. The peaking amplifiers 231 and 232 are connected to a terminal of the RF output signal $RF_{out}$ without using the impedance inverter to amplify a peak signal in each of the RF input signals $RF_{in}$ having opposite phases, and a signal having an amplitude of approximately twice a sum of amplitudes of the peak signals of the inverted RF input signal $RF_{in}$ and the non-inverted RF input signal $RF_{in}$ may be output in a differential mode. However, since voltages applied to the carrier amplifiers 221 and 222 or currents flowing therein have a same phase, noise included in the voltages or currents may be canceled out of the output of the carrier amplifiers 221 and 222. In addition, since voltages applied to the peaking amplifiers 231 and 232 or currents flowing therein have a same phase, noise included in the voltages or currents may be canceled out of the output of the peaking amplifiers 231 and 232. Accordingly, the power amplifier system 100-3 for performing differential amplification may have high linear power and high efficiency. For example, when each of the carrier amplifiers 221 and 222 has an operating point in a class B and each of the peaking amplifiers 231 and 232 has an operating point in a class C, the peaking amplifiers 231 and 232 start operations thereof when the carrier amplifiers 221 and 222 are saturated.

The drive stage 20-3 may be implemented as a single IC by a semiconductor manufacturing process using a substrate containing silicon. The semiconductor manufacturing process using the substrate containing silicon has a relatively lower cost than a semiconductor manufacturing process using a substrate containing gallium arsenide. Accordingly, when the drive stage 20-3 is implemented in a silicon substrate, a cost of the power amplifier system 100-3 may be lowered. Furthermore, since the power amplifier system 100-3 occupies a largest proportion of a unit cost of a communication module, the unit cost of the communication module may be greatly reduced.

The input matching unit 10-3 and the drive stage 20-3 may be manufactured together as one IC by the semiconductor manufacturing process using the substrate containing silicon. In addition, in contrast the drive stage 20, the input matching unit 10-3 may not be implemented inside the IC, and may be directly mounted in the communication module independently of the IC. In this case, since the input matching unit 10-3 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Further, in the case in which the input matching unit 10-3 includes a phase compensation circuit, when the inter-stage matching unit 10-3 is manufactured as a single IC together with the drive stage 20-3, an IC manufacturing cost may increase compared with a case in which the input matching unit 10-3 does not include the phase compensation circuit, due to an area occupied by the phase compensation circuit. Accordingly, in the case in which the input matching unit 10-3 includes the phase compensation circuit, when the input matching unit 10 is directly mounted in the communication module independently of the IC, a total manufacturing cost may be minimized. In addition, when the phase compensation circuit of the input matching unit 10-3 is directly mounted in the communication module independently of the IC, changes in load impedance of the carrier amplifier 221/222 and the peaking amplifier 231/232 may be optimized by optimizing inductance values or capacitance values of circuit elements constituting the phase compensation circuit.

The inter-stage matching unit 30-3 may match impedance of a signal transfer path between the drive terminal 20-3 and a power stage 40-2, and does not include a phase compensation circuit. The inter-stage matching unit 30-3 may include a plurality of inter-stage matching circuits 37 and 38. For example, each of the inter-stage matching circuits 37 and 38 may be a circuit in which an inductor and a capacitor are connected to each other, and may include a transformer. The inter-stage matching circuits 37 and 38 are connected to a pair of carrier amplifiers 431 and 432 of the power stage 40-2 and a pair of peaking amplifiers 441 and 442 of the power stage 40-2, respectively. In addition, each of the inter-stage matching circuits 37 and 38 may be divided into parts, which are respectively connected to the carrier amplifiers 431 and 432 and the peaking amplifiers 441 and 442 one-by-one. However, the inter-stage matching unit 30-3 may be omitted in the power amplifier system 100.

The power stage 40-2 amplifies an RF signal from the drive stage 20-3 by receiving power. The power stage 40-2 includes the pair of carrier amplifiers 431 and 432 and the pair of peaking amplifiers 441 and 442. The pair of the carrier amplifiers 431 and 431 of the power stage 40-2 are connected to a terminal of the RF output signal $RF_{out}$ through an impedance inverter, and the pair of the carrier amplifiers 441 and 431 are connected to the terminal of the RF output signal $RF_{out}$ using the impedance inverter. The base signals amplified through the carrier amplifiers 221 and 222 of the drive stage 20-3 may be amplified through the carrier amplifiers 431 and 432, and the peak signals amplified through the peaking amplifiers 231 and 232 of the drive stage 20-3 may be amplified through the carrier amplifiers 441 and 442. Accordingly, amplification efficiency of the power stage 40-2 as well as amplification efficiency of the drive stage 20-3 may be increased at both low input power and high input power, and thus amplification efficiency of the power amplifier system 100-3 may be maximized. For example, when each of the carrier amplifiers 431 and 432 has an operating point in a class B and each of the peaking amplifiers 441 and 442 has an operating point in a class C, the peaking amplifiers 441 and 442 start operations thereof when the carrier amplifiers 431 and 432 are saturated.

The power stage 40-2 may be implemented as a single IC by a semiconductor manufacturing process using a substrate containing gallium arsenic. An IC formed on a substrate containing gallium arsenide can achieve higher power and higher linearity than an IC formed on the substrate containing silicon, and thus the RF signal amplified through the carrier amplifiers 431 and 432 and the peaking amplifiers 441 and 442 of the power stage 40-2 may have high power and linearity, and may have high reliability.

An output matching unit 50-2 may match impedance of a signal transfer path between the power stage 40-2 and a terminal through which the amplified RF output signal $RF_{out}$ is output, and may change phases of the signals output from the carrier amplifiers 431 and 431 of the power stage 40-2 and synthesize the phase-changed signals output from the carrier amplifiers 431 and 431 with the signals output from the peaking amplifiers 441 and 442 of the power stage 40-2 to form synthesized RF signals, and then output the synthesized RF signals to the terminal of the RF output signal $RF_{out}$. The output matching unit 50-2 may include a plurality of output matching circuits 56, 57, and 58. For example, each of the output matching circuits 56, 57, and 58 may be a circuit in which an inductor and a capacitor are connected to each other, and may include a transformer. However, the output matching unit 50-2 may be omitted in the power amplifier system 100.

One of the output matching circuits 56, 57, and 58 may include a quarter wave circuit for changing a phase of a signal that is input thereto. In addition, the quarter wave circuit may not be included in the output matching circuits 56, 57, and 58, and may be independently implemented. The quarter wave circuit may be one of the impedance inverters, and may be connected to an output terminal of the carrier amplifiers 431 and 432 of the power stage 40-2. Such a quarter wave circuit, which is a circuit in which an inductor and a capacitor are connected, is included within the output matching unit, and thus an area occupied by the quarter wave circuit in the power amplifier system 100-3 is smaller than a case in which a quarter wave transmission line is used. Herein, the quarter wave transmission line is a circuit element that is independent of the inter-stage matching circuit and has a large size. For example, the quarter wave circuit may be any one of the circuits illustrated in FIG. 2. In FIG. 2, the circuits 1001 and 1002 may perform a phase change of +90 degrees, and the circuits 1003 and 1004 may perform a phase change of −90 degrees.

The output matching unit 50-2 and the power stage 40-2 may be manufactured together as one IC by the semiconductor manufacturing process using the substrate containing gallium arsenide. In addition, in contrast to the power stage 40-2, the output matching unit 50-2 may not be implemented inside the IC, and may be directly mounted in the communication module independently of the IC. In this case, since the output matching unit 50-2 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

The inter-stage matching unit 30-3 may be manufactured as a single IC by a semiconductor manufacturing process using a substrate containing gallium arsenide, together with the power stage 40-2. In addition, the inter-stage matching unit 30-3 may be manufactured as a single IC by a semiconductor manufacturing process using a substrate containing silicon, together with the drive stage 20, and, in this case, the manufacturing cost may be lower than a case in which the substrate containing gallium arsenic is used.

The inter-stage matching unit 30-3 may also not be included anywhere inside the IC in which the drive stage 20-3 is implemented or the IC in which the power stage 40-2 is implemented, and may be directly mounted in the communication module independently of these ICs. In this case, since the inter-stage matching unit 30-3 is not implemented inside the IC, which is expensive, a total manufacturing cost may be reduced. In addition, in this case, since circuit elements having inductance values or capacitance values that are difficult to be used inside the IC may be directly mounted on the communication module, loss of an RF signal may be minimized and circuit optimization may be facilitated.

Figure 6:
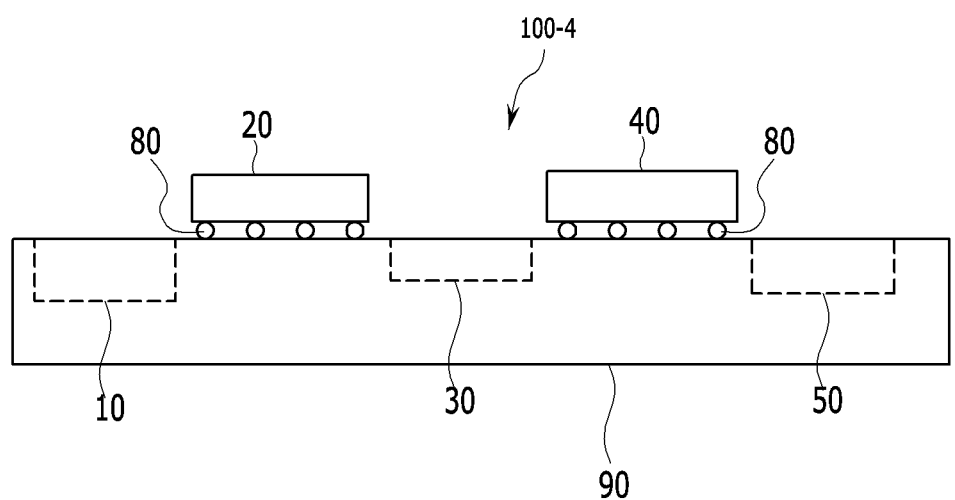
FIG. 6 illustrates a cross-section of a power amplifier system, according to an embodiment.

FIG. 6 illustrates a cross-section of a power amplifier system 100-4, according to an exemplary embodiment.

Referring to FIG. 6, the power amplifier system 100-4 includes the input matching unit 10, the drive stage 20, the inter-stage matching unit 30, the power stage 40, and the output matching unit 50. The drive stage 20 and the power stage 40 are connected to each other through an electrical connection structure 80 on a base substrate 90. For example, the electrical connection structure 80 may have a structure such as a solder ball, a pin, a land, or a pad. The drive stage 20 may be implemented as a single IC by a semiconductor manufacturing process using a substrate containing silicon, and the power stage 40 may be implemented as a single IC by a semiconductor manufacturing process using a substrate containing gallium arsenic.

Each of the input matching unit 10, the inter-stage matching unit 30, and the output matching unit 50 are integrated inside the base substrate 90. In addition, at least one of the input matching unit 10, the inter-stage matching unit 30, and the output matching unit 50 may be installed outside the base substrate 90 independently of the drive stage 20 and the power stage 40. At least one of the input matching unit 10 and the inter-stage matching unit 30 may be manufactured as a single IC together with the drive stage 20 to be connected to the base substrate 90 through the electrical connection structure 80. At least one of the inter-stage matching unit 30 and the output matching unit 50 may be manufactured as a single IC together with the power stage 40 to be connected to the base substrate through the electrical connection structure 80.

Referring to FIG. 6, the power stage 40., which requires relatively high linear power, may be implemented in a substrate containing gallium arsenide to implement the drive stage 20, which requires relatively low power, on a substrate containing silicon having a low unit cost while efficiency of the power amplifier system 100-4 is increased, thereby reducing a cost of the power amplifier system 100-4. At the same time, it is possible to facilitate power loss minimization and circuit optimization while reducing a manufacturing cost by directly mounting the inter-stage matching unit 30 in a communication module independently of the drive stage 20 and the power stage 40.

Figure 7:
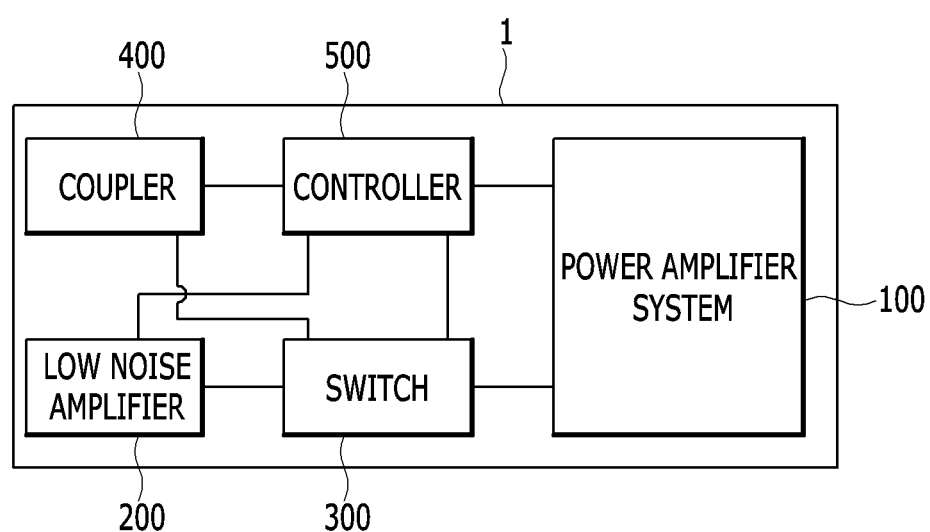
FIG. 7 illustrates a top plan view of a communication system according to an embodiment.

FIG. 7 illustrates a top plan view of a communication system 1, according to an embodiment.

Referring to FIG. 7, the communication system 1 may include the power amplifier system 100, a low noise amplifier 200, a switch 300, a coupler 400, and a controller 500.

Among the components constituting the communication system 1, the power amplifier system 100 occupies a largest area in the communication system 1. Accordingly, as described above, since the power amplifier system 100 has a small area, an entire size of the communication system 1 may be reduced.

The power amplifier system 100 may amplify an RF signal transmitted through an antenna. Accordingly, linear power and efficiency of the power amplifier system 100 may be increased, and reliability of the power amplifier system 100 may be increased, so that the communication system 1 may sufficiently satisfy the 5G NR standard.

The low noise amplifier 200 amplifies an RF signal received through an antenna. The low noise amplifier 200 may amplify a very small level of RF signal while distinguishing the RF signal from noise. That noise amplifier 200 may be disposed near the antenna. A band stop filter may be connected between the low noise amplifier 200 and the switch 300. The band stop filter may allow only a signal of a specific frequency band to not pass therethrough.

The switch 300 may change a path for an RF signal passing through the power amplifier system 100 and the low noise amplifier 200. For example, the switch 300 may be configured to allow either the power amplifier system 100 or the low noise amplifier 200 to receive the RF signal. In addition, the switch 300 may connect the power amplifier system 100 with the controller 500 of the communication system 1, or may connect the power amplifier system 100 with a communication system having a different communication standard from that of the communication system 1. The switch 300 may also connect the low noise amplifier 200 with the controller 500 of the communication system 1, or may connect the low noise amplifier 200 with a communication system having a different communication standard from that of the communication system 1.

The coupler 400 may perform power sampling or power dividing on an input RF signal. The coupler 400 is connected to the switch 300. For example, the coupler 400 may detect power of the RF signal passing through the power amplifier system 100 and the low noise amplifier 200, and the detected power may be used to control the power amplifier system 100 and the low noise amplifier 200 by using the controller 500. In addition, the coupler 400 may divide and transmit an RF signal, and divided RF signals may be used in a plurality of communication systems, respectively. A band pass filter may be connected between the coupler 400 and the switch 300. The band pass filter may transfer only a signal of a specific frequency band to a next stage, and may remove noise.

The controller 500 may be connected to the power amplifier system 100, the low noise amplifier 200, the switch 300, and the coupler 400 to control the power amplifier system 100, the low noise amplifier 200, the switch 300, and the coupler 400. The controller 500 may include a memory, a processor, and the like to perform digital signal processing.

The communication system 1 may be implemented in electronic devices. For example, the electronic device may be a smart phone, a personal digital assistant, a digital video camera, a digital still camera, a network system, a computer, a monitor, a tablet, a laptop, a network, a television, a video game, a smart watch, an automotive device, or the like, but is not limited to such examples.

The input matching units 10, 10-1, 10-2, and 10-3, the drive stages 20, 20-1, 20-2, and 20-3, the inter-stage matching units 30, 30-1, 30-2, and 30-3, the power stages 40, 40-1, and 40-2, the output matching units 50, 50-1, and 50-2, the coupler 400, and the controller 500 in FIGS. 1-7 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-7 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD–Rs, CD+Rs, CD-RWs, CD+RWs, DVD-ROMs, DVD–Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier system, comprising:
a drive stage configured to amplify an RF input signal and implemented in a substrate containing silicon;
a power stage including a carrier amplifier configured to amplify a base signal from the RF input signal as amplified by the drive stage, and a peaking amplifier configured to amplify a peak signal from the RF input signal as amplified by the drive stage, the power stage being implemented in a substrate containing gallium arsenide; and
a phase compensation circuit configured to change a phase of the RF input signal,
wherein either the carrier amplifier or the peaking amplifier is connected to the phase compensation circuit, and
wherein the carrier amplifier has an operating point in a class B and the peaking amplifier has an operating point in a class C.

2. The power amplifier system of claim 1, further comprising:
a first integrated circuit (IC) in which the drive stage is implemented; and
a second IC in which the power stage is implemented independently of the first IC.

3. The power amplifier system of claim 2, further comprising:
a quarter wave circuit connected to an output stage of the carrier amplifier and configured to change a phase of the amplified base signal.

4. The power amplifier system of claim 1, further comprising:
an inter-stage matcher including the phase compensation circuit, and configured to match impedance of a signal transfer path between the drive stage and the power stage.

5. The power amplifier system of claim 1, further comprising:
an input matcher including the phase compensation circuit, and configured to match impedance of a signal transfer path between a terminal for receiving the RF input signal and the drive stage.

6. The power amplifier system of claim 5, wherein the drive stage includes:
another carrier amplifier configured to amplify a base signal from the RF input signal; and
another peaking amplifier configured to amplify a peak signal from the RF input signal.

7. The power amplifier system of claim 1, wherein the RF input signal includes an inverted RF input signal and a non-inverted RF input signal, and the drive stage is further configured to amplify a difference between the inverted RF input signal and the non-inverted RF input signal.

8. The power amplifier system of claim 1, wherein the drive stage includes:
a first drive amplifier configured to receive and amplify a non-inverted RF input signal of the RF input signal; and
a second drive amplifier configured to receive and amplify an inverted RF input signal of the RF input signal.

9. The power amplifier system of claim 8, wherein the carrier amplifier includes:
a first carrier amplifier configured to amplify a base signal from the non-inverted RF input signal as amplified by the first drive amplifier; and
a second carrier amplifier configured to amplify a base signal from the inverted RF input signal as amplified by the second drive amplifier, and
wherein the peaking amplifier includes:
a first peaking amplifier configured to amplify a peak signal from the non-inverted RF input signal as amplified by the first drive amplifier; and
a second peaking amplifier configured to amplify a peak signal from the inverted RF input signal as amplified by the second drive amplifier.

10. The power amplifier system of claim 1, wherein the drive stage includes:
a first carrier amplifier configured to amplify a base signal from a non-inverted RF input signal of the RF input signal;
a second carrier amplifier configured to amplify a base signal from an inverted RF input signal of the RF input signal;
a first peaking amplifier configured to amplify a peak signal from the non-inverted RF input signal of the RF input signal; and
a second peaking amplifier configured to amplify a peak signal from the inverted RF input signal of the RF input signal.

11. The power amplifier system of claim 10, wherein the carrier amplifier further includes:
a third carrier amplifier configured to further amplify the amplified base signal from the non-inverted RF input signal; and
a fourth carrier amplifier configured to further amplify the amplified base signal from the inverted RF input signal, and
wherein the peaking amplifier includes:
a third peaking amplifier configured to further amplify the amplified peak signal from the non-inverted RF input signal; and a fourth peaking amplifier configured to further amplify the amplified peak signal from the inverted RF input signal.

12. A power amplifier system, comprising:
a drive stage configured to amplify an RF input signal and implemented in a substrate containing silicon;
a power stage including a carrier amplifier configured to amplify a base signal from the RF input signal as amplified by the drive stage, and a peaking amplifier configured to amplify a peak signal from the RF signal as amplified by the drive stage, the power stage being implemented in a substrate containing gallium arsenide; and
an output matcher including a quarter wave circuit configured to match impedance of a signal transfer path between the power stage and a terminal for outputting an RF output signal, and change a phase of the amplified base signal,
wherein the carrier amplifier has an operating point in a class B and the peaking amplifier has an operating point in a class C.

13. The power amplifier system of claim 12, further comprising:
an inter-stage matcher including a phase compensation circuit configured to match impedance of a signal transfer path between the drive stage and the power stage, and change a phase of the RF input signal.

14. The power amplifier system of claim 12, further comprising:
an input matcher including a phase compensation circuit configured to match impedance of a signal transfer path between a terminal for receiving the RF input signal and the power stage, and change the phase of the RF signal.

15. The power amplifier system of claim 14, wherein the drive stage includes:
another carrier amplifier configured to amplify a base signal from the RF input signal; and
another peaking amplifier configured to amplify a peak signal from the RF input signal.

16. The power amplifier system of claim 12, wherein the RF input signal includes an inverted RF input signal and a non-inverted RF input signal, and the drive stage is further configured to amplify a difference between the inverted RF input signal and the non-inverted RF input signal.

17. A power amplifier system, comprising:
a first integrated circuit (IC) formed on a first substrate made of a first material, the first IC including a drive stage configured to amplify an RF input signal;
a second IC formed on a second substrate made of a second material different from the first material, the second IC including a carrier amplifier configured to amplify a base signal from the RF input signal as amplified by the drive stage, and a peaking amplifier configured to amplify a peak signal from the RF input signal as amplified by the drive stage; and
a phase compensation circuit connected to the power stage, and configured to change a phase of the RF input signal,
wherein the carrier amplifier has an operating point in a class B and the peaking amplifier has an operating point in a class C.

18. The power amplifier system of claim 17, wherein the phase compensation circuit is disposed in the first IC or the second IC.

19. The power amplifier system of claim 17, wherein the phase compensation circuit is disposed in a base substrate on which the first IC and the second IC are mounted.

20. The power amplifier system of claim 17, wherein the phase compensation circuit is disposed in either one of an inter-stage matcher configured to match impedance of a signal transfer path between the drive stage and the power stage, and an input matcher configured to match impedance of a signal transfer path between an input terminal for the RF input signal and the drive stage.

* * * * *